(12) United States Patent
Shen et al.

(10) Patent No.: US 6,960,914 B2
(45) Date of Patent: Nov. 1, 2005

(54) METHODS AND APPARATUS FOR IMAGING SYSTEMS

(75) Inventors: Weijun Shen, Florence, SC (US); Jinhua Huang, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 117 days.

(21) Appl. No.: 10/607,747

(22) Filed: Jun. 27, 2003

(65) Prior Publication Data

US 2004/0263165 A1 Dec. 30, 2004

(51) Int. Cl.⁷ .............................................. G01V 3/00
(52) U.S. Cl. .................................. 324/319; 324/318
(58) Field of Search ................................ 324/319, 318, 324/322, 300, 309, 307; 361/19

(56) References Cited

U.S. PATENT DOCUMENTS

| | | | |
|---|---|---|---|
| 4,926,289 A | 5/1990 | Reichert | |
| 5,029,287 A | 7/1991 | Dessalles-Martin et al. | |
| 5,210,512 A | 5/1993 | Davies | |
| 5,278,380 A | 1/1994 | Lowry | |
| 5,329,266 A | 7/1994 | Soeldner et al. | |
| 5,359,310 A | * 10/1994 | Pissanetzky | 335/301 |
| 5,426,366 A | 6/1995 | Overweg et al. | |
| 5,523,914 A | 6/1996 | Weck et al. | |
| 5,539,367 A | * 7/1996 | Xu et al. | 335/301 |
| 5,644,233 A | 7/1997 | Bird et al. | |
| 5,650,903 A | * 7/1997 | Gross et al. | 361/19 |
| 5,731,939 A | * 3/1998 | Gross et al. | 361/19 |
| 5,739,997 A | * 4/1998 | Gross | 361/19 |
| 5,952,269 A | 9/1999 | Ma et al. | |
| 6,147,844 A | * 11/2000 | Huang et al. | 361/19 |
| 6,169,399 B1 | 1/2001 | Zhang et al. | |
| 6,307,370 B1 | 10/2001 | Schauwecker et al. | |
| 6,369,464 B1 | 4/2002 | Schauwecker et al. | |
| 6,476,700 B2 | 11/2002 | Schauwecker et al. | |
| 6,563,316 B2 | * 5/2003 | Schauwecker et al. | 324/318 |
| 6,717,781 B2 | * 4/2004 | Xu et al. | 361/19 |

* cited by examiner

*Primary Examiner*—Brij B. Shrivastav
(74) *Attorney, Agent, or Firm*—Carl B. Horton, Esq.; Armstrong Teasdale LLP (57) ABSTRACT

A method of operating an imaging system having a main coil and a shield coil electromagnetically coupled to the main coil, wherein the method includes monitoring for an external environmental fluctuation of electromagnetism, and controlling current flow through the main and shield coils based upon the monitoring using a quench heater.

22 Claims, 8 Drawing Sheets

PRIOR ART

METHODS AND APPARATUS FOR IMAGING SYSTEMS

BACKGROUND OF THE INVENTION

This invention relates to a Magnetic Resonance Imaging (MRI) system. More particularly, this invention relates to superconducting coils used in MRI systems for correcting central magnetic field temporal shift, and for shielding external magnetic disturbances from large electromagnetic fields.

A highly uniform magnetic field is useful for nuclear resonance image (MRI) and nuclear magnetic resonance (NMR) systems as medical devices or chemical/biological devices. Most popular systems currently available worldwide use a superconducting magnet system which creates a highly uniform field in a pre-determined space (imaging volume). A superconducting magnet system usually uses multiple superconducting coils (main coil system) to achieve a desired highly uniform magnetic field in the imaging volume. More advanced superconducting MRI and NMR magnet systems also use an active shielding technique which adds a second set of multiple coils (shielding coil system) which creates a reverse direction magnetic field to reduce the fringe magnetic field and to achieve a significant reduction of the external magnetic field in the surrounding space of the magnet system. Depending on the design, the main coils system and shielding coils system can use a single circuit running the same electrical current, or two individual circuits running either the same current or two different currents. From the laws of physics, one knows that for a single superconductive closed loop, the total magnetic flux inside of the loop does not change. However, for a multi-coil system, especially for an actively shielded MRI magnet system with main coils and shielding coils connected in series, the situation is a little different.

Due to the environment disturbances, such as a train and/or other moving vehicles, rotating machinery, elevators, etc, in the surrounding area, the magnetic field of the system will have a corresponding temporal magnetic flux change. Practically, all magnet systems are subject to such temporal field instability ranging from ppm (parts per million) to ppb (parts per billion). But for actively shielded magnet systems, this change is more severe. For good image quality, the temporal field variation of a typical MRI should normally be less than 0.05 to 0.1 ppm/hour. The stability of the magnet center field is, however, highly affected by the environment disturbances, especially for those actively shielded magnets. The magnitude of the field fluctuations depends on both the size of the object and the distance away from the magnet system. For example, a typical elevator 20 feet away from the magnet can cause a field fluctuation of about 0.01 Gauss or 1.0E-6 Tesla, a subway can also cause a 0.1 Gauss field fluctuation.

Clearly, these environment disturbances included changes in both center magnetic field and its homogeneity will cause detectable deviation of the nuclear imaging quality (imaging distortion) for MRI and NMR devices.

In order to minimize such effects caused by environment changes and other disturbances, the electrical currents changing in both main coils and shielding coils should be controlled or limited to some prescribed acceptable level such that the environment disturbance is compensated and the center magnetic field remains constant and uniform. One structure and method has been described in U.S. Pat. No. 4,926,289 for such purpose by using a single filament or a few filaments of superconducting wire for the purpose of having low critical current. However, it would be desirable to provide methods and apparatus which are not constrained to filament(s) with low critical current.

In one aspect, a method of operating an imaging system having a main coil and a shield coil electromagnetically coupled to the main coil is provided. The method includes monitoring for an external environmental fluctuation of electromagnetism, and controlling current flow through the main and shield coils based upon the monitoring using a quench heater.

In another aspect, an imaging system includes a main coil, a shield coil positioned to shield an electromagnetic field generated by the main coil, and at least one environmental fluctuation circuit operationally coupled to at least one of the shield coil, the main coil the circuit including at least one detection coil, and a quench heater positioned proximate the detection coil.

In a further aspect, a method of operating an imaging system comprising a main coil, a shield coil positioned to shield an electromagnetic field generated by the main coil, and at least one environmental fluctuation circuit operationally coupled to at least one of the main coil and the shield coil, the circuit comprising at least one detection coil, and a quench heater positioned proximate the detection coil is provided. The method includes energizing the quench heater such that the detection coil is in a non-superconductive state, supplying current to the main coil and the shield coil until a predetermined current is reached while the detection coil is in the non-superconductive state, activating a persistence switch to a superconductive state, and de-energizing the quench heater when the persistence switch is in the superconductive state.

DETAILED DESCRIPTION OF THE INVENTION

Herein described are methods and apparatus which utilize a current limiter for active shielding of a superconducting magnet system used in MRI and NMR magnetic field generators. More specifically, in one embodiment, a detection system is provided for an active shielding of superconducting magnet systems which use a single electrical current as explained in greater detail below. In another embodiment, a detection system is provided for an active shielding of a multiple electrical circuits superconducting magnet system as also explained in greater detail below. The herein described methods and apparatus use a combination of a detection mechanism and a controlled triggering level to limit the electrical current induced by environment disturbances.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features. Additionally, as is known in the art, a reference to a main coil contemplates a plurality of coils, and therefore the terms main coil and main coils are used interchangeably herein. For the same reason, the terms shield coil and shield coils are also interchangeable herein.

Figure 1:
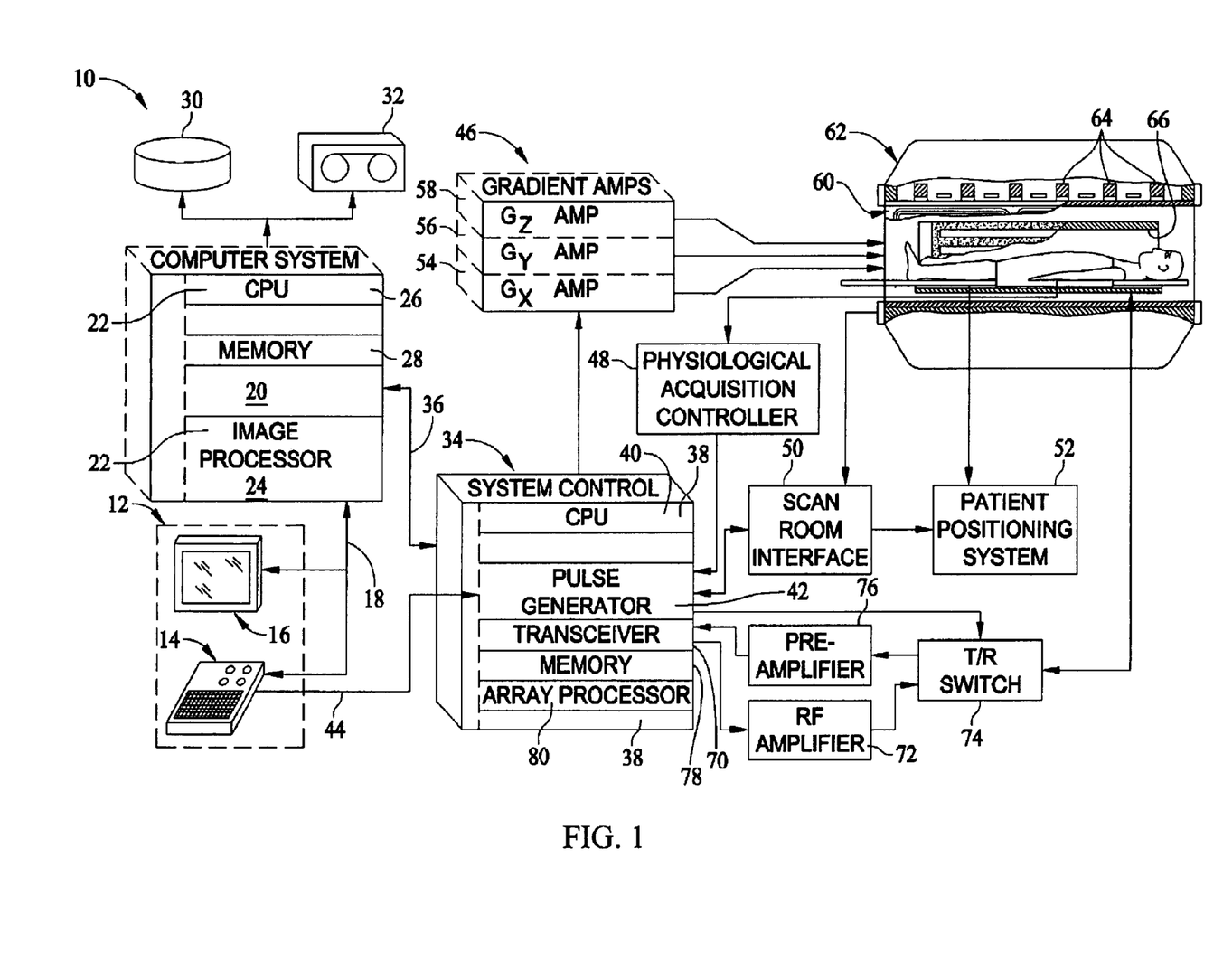
FIG. 1 is a block schematic diagram of a Magnetic Resonance Imaging (MRI) system.

FIG. 1 is a block diagram of an embodiment of a magnetic resonance imaging (MRI) system 10 in which the herein described systems and methods are implemented. MRI 10 includes an operator console 12 which includes a keyboard and control panel 14 and a display 16. Operator console 12 communicates through a link 18 with a separate computer system 20 thereby enabling an operator to control the production and display of images on screen 16. Computer system 20 includes a plurality of modules 22 which communicate with each other through a backplane. In the exemplary embodiment, modules 22 include an image processor module 24, a CPU module 26 and a memory module 28, also referred to herein as a frame buffer for storing image data arrays. Computer system 20 is linked to a disk storage 30 and a tape drive 32 to facilitate storing image data and programs. Computer system 20 communicates with a separate system control 34 through a high speed serial link 36.

System control 34 includes a plurality of modules 38 electrically coupled using a backplane (not shown). In the exemplary embodiment, modules 38 include a CPU module 40 and a pulse generator module 42 that is electrically coupled to operator console 12 using a serial link 44. Link 44 facilitates transmitting and receiving commands between operator console 12 and system command 34 thereby allowing the operator to input a scan sequence that MRI system 10 is to perform. Pulse generator module 42 operates the system components to carry out the desired scan sequence, and generates data which indicative of the timing, strength and shape of the RF pulses which are to be produced, and the timing of and length of a data acquisition window. Pulse generator module 42 is electrically coupled to a gradient amplifier system 46 and provides gradient amplifier system 46 with a signal indicative of the timing and shape of the gradient pulses to be produced during the scan. Pulse generator module 42 is also configured to receive patient data from a physiological acquisition controller 48. In the exemplary embodiment, physiological acquisition controller 48 is configured to receive inputs from a plurality of sensors indicative of a patient's physiological condition such as, but not limited to, ECG signals from electrodes attached to the patient. Pulse generator module 42 is electrically coupled to a scan room interface circuit 50 which is configured to receive signals from various sensors indicative of the patient condition and the magnet system. Scan room interface circuit 50 is also configured to transmit command signals such as, but not limited to, a command signal to move the patient to a desired position with a patient positioning system 52.

The gradient waveforms produced by pulse generator module 42 are input to gradient amplifier system 46 that includes a $G_x$ amplifier 54, a $G_Y$ amplifier 56, and a $G_Z$ amplifier 58. Amplifiers 54, 56, and 58 each excite a corresponding gradient coil in gradient coil assembly 60 to generate a plurality of magnetic field gradients used for position encoding acquired signals. In the exemplary embodiment, gradient coil assembly 60 includes a magnet assembly 62 that includes a polarizing magnet 64 and a whole-body RF coil 66.

In use, a transceiver module 70 positioned in system control 34 generates a plurality of electrical pulses which are amplified by an RF amplifier 72 that is electrically coupled to RF coil 66 using a transmit/receive switch 74. The resulting signals radiated by the excited nuclei in the patient are sensed by RF coil 66 and transmitted to a preamplifier 76 through transmit/receive switch 74. The amplified NMR (nuclear magnetic resonance) signals are then demodulated, filtered, and digitized in a receiver section of transceiver 70. Transmit/receive switch 74 is controlled by a signal from pulse generator module 42 to electrically connect RF amplifier 72 to coil 66 during the transmit mode and to connect preamplifier 76 during the receive mode. Transmit/receive switch 74 also enables a separate RF coil (for example, a surface coil) to be used in either the transmit or receive mode.

The NMR signals received by RF coil 66 are digitized by transceiver module 70 and transferred to a memory module 78 in system control 34. When the scan is completed and an array of raw k-space data has been acquired in the memory module 78, the raw k-space data is rearranged into separate k-space data arrays for each cardiac phase image to be reconstructed, and each of these arrays is input to an array processor 80 configured to Fourier transform the data into an array of image data. This image data is transmitted through serial link 36 to computer system 20 where it is stored in disk memory 30. In response to commands received from operator console 12, this image data may be archived on tape drive 32, or it may be further processed by image processor 24 and transmitted to operator console 12 and presented on display 16.

Figure 2:
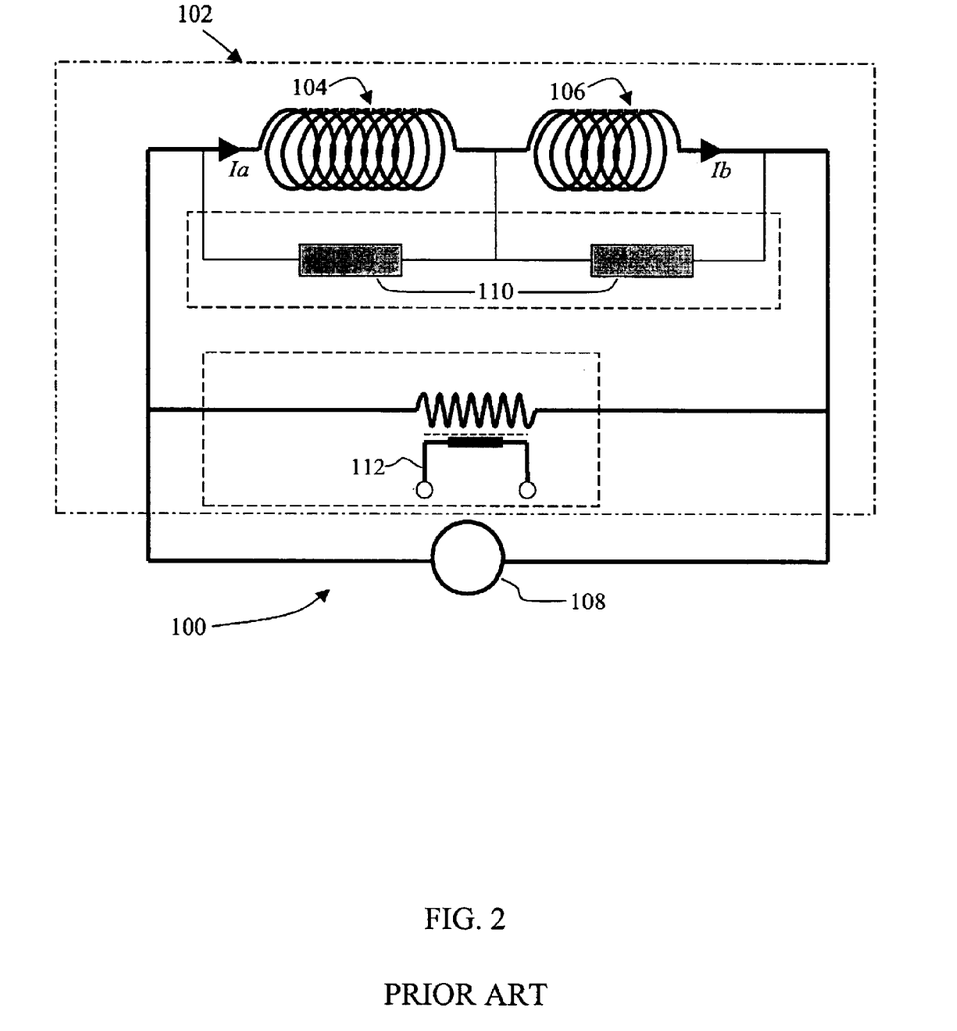
FIG. 2 is a schematic diagram of a conventional circuitry of a superconducting current limiter for superconducting MRI, NMR magnet system.

FIG. 2 illustrates a conventional circuitry of a superconducting MRI system 100 including a cryogenic temperature cryostat 102 in which a main coil 104, a shielding coil 106, a quench protection system 110, and a superconducting persistent switch 112 are positioned. A power supply 108 is typically positioned outside cryostat 102. During a magnet system energizing process, persistent switch 112 is in an off mode (i.e., a resistive state). Energy is supplied to main coil 104 and shielding coil 106 from power supply 108 until a desired magnetic field is produced, then persistent switch 112 is switched to an on mode (i.e., a superconductive state). Without electromagnetic disturbance, electrical current $I_a$ of main coils 104, and electrical current $I_b$ of shielding coils 106 is the same in persistent mode. Upon an environment disturbance occurring, main coil electrical current $I_a$ and shielding coil electrical current $I_b$ can change slightly since the laws of physics necessitates only that a total magnetic flux of both main and shielding coils 104 and 106 together will attempt to remain constant.

Figure 3:
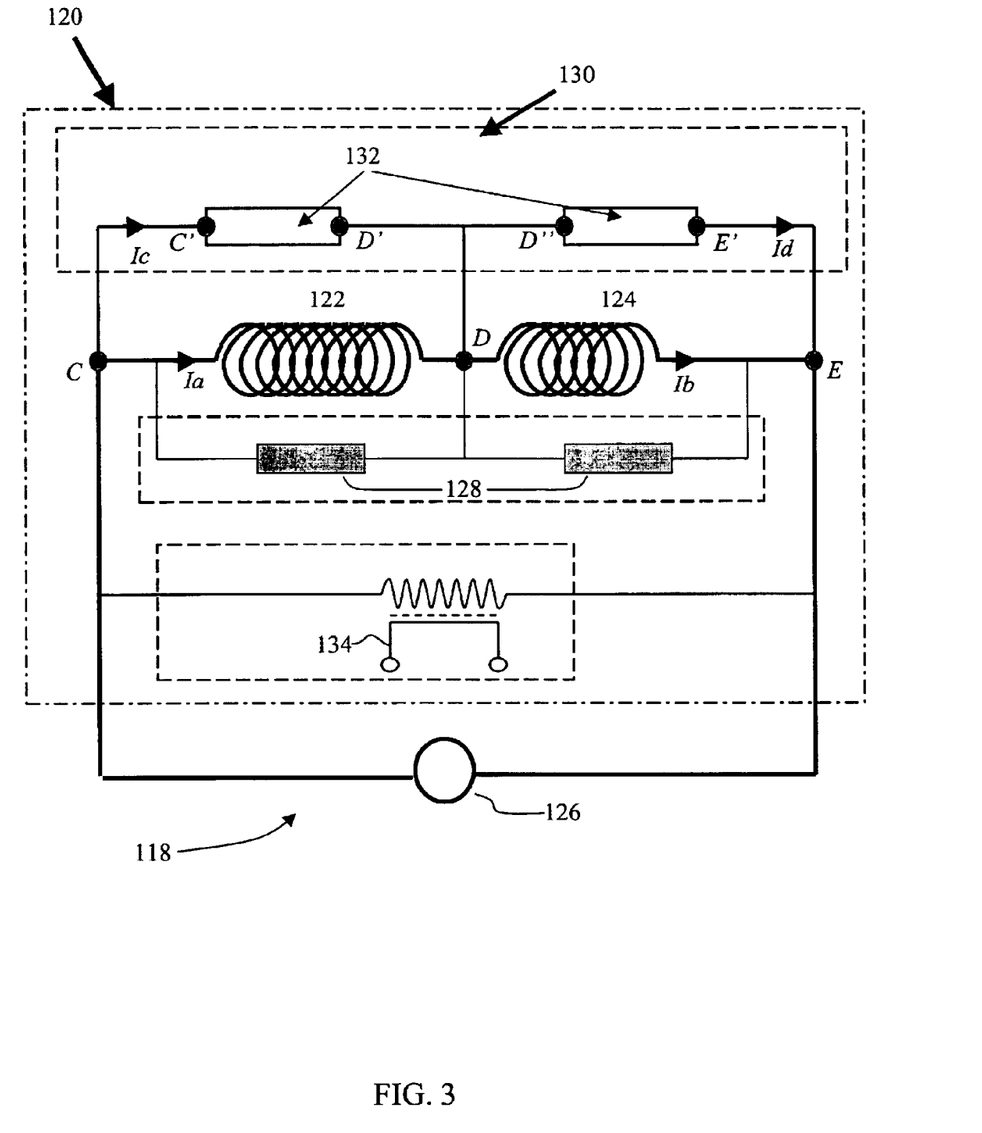
FIG. 3 is a schematic diagram of a circuitry of the superconducting MRI, NMR magnet system illustrated in FIG. 1 with a detection system.

FIG. 3 illustrates a circuitry of MRI system 10 including a two coil detection system 118. MRI system 10 includes a cryogenic temperature cryostat 120 in which a main coil 122, a shielding coil 124, a quench protection system 128, and a superconducting persistent switch 134 are positioned. A power supply 126 is typically positioned outside cryostat 120. Detection system 118 includes an environmental fluctuation circuit 130. In an exemplary embodiment, main coil 122 and shield coil 124 are wired in series receiving the same current, and environmental fluctuation circuit 130 includes two environmental fluctuation circuits 132, one for main coil 122, and one for shield coil 124. During a magnet system energizing process, persistent switch 134 is in an off mode (i.e., a resistive state). Energy is supplied to main coil 122 and shielding coil 124 from power supply 126 until a desired magnetic field is produced, then persistent switch 134 is switched to an on mode (i.e., a superconductive state). During the just described magnet ramping, a pair of quench heaters (not shown in FIG. 3) are turned on, thus the sections of CC'D'D and DD"E'E are resistive and prevent electrical current to flow therethrough, and all electrical current flows through main coil 122 and shielding coil 124. After the magnet (coils 122 and 124) reaches a desired field level, and are shimmed and parked using conventional methods, the quench heaters of environmental fluctuation circuits 132 are turned off, and sections CC'D'D and DD"E'E return to a superconductive state. When an outside disturbance is present, both electrical currents in main coil 122 and shield coil 124 may start to change. Since coils 122 and 124 and environmental fluctuation circuits 132 are in the same circuit, any induced current flows through either CC'D'D, or DD'E'E circuit, or both circuits. Thus with the aid of a detection and controlling scheme identical or similar to that illustrated in FIG. 5, currents $I_c$ and $I_d$ are detected, limited, and/or controlled as explained below in greater detail.

Figure 4:
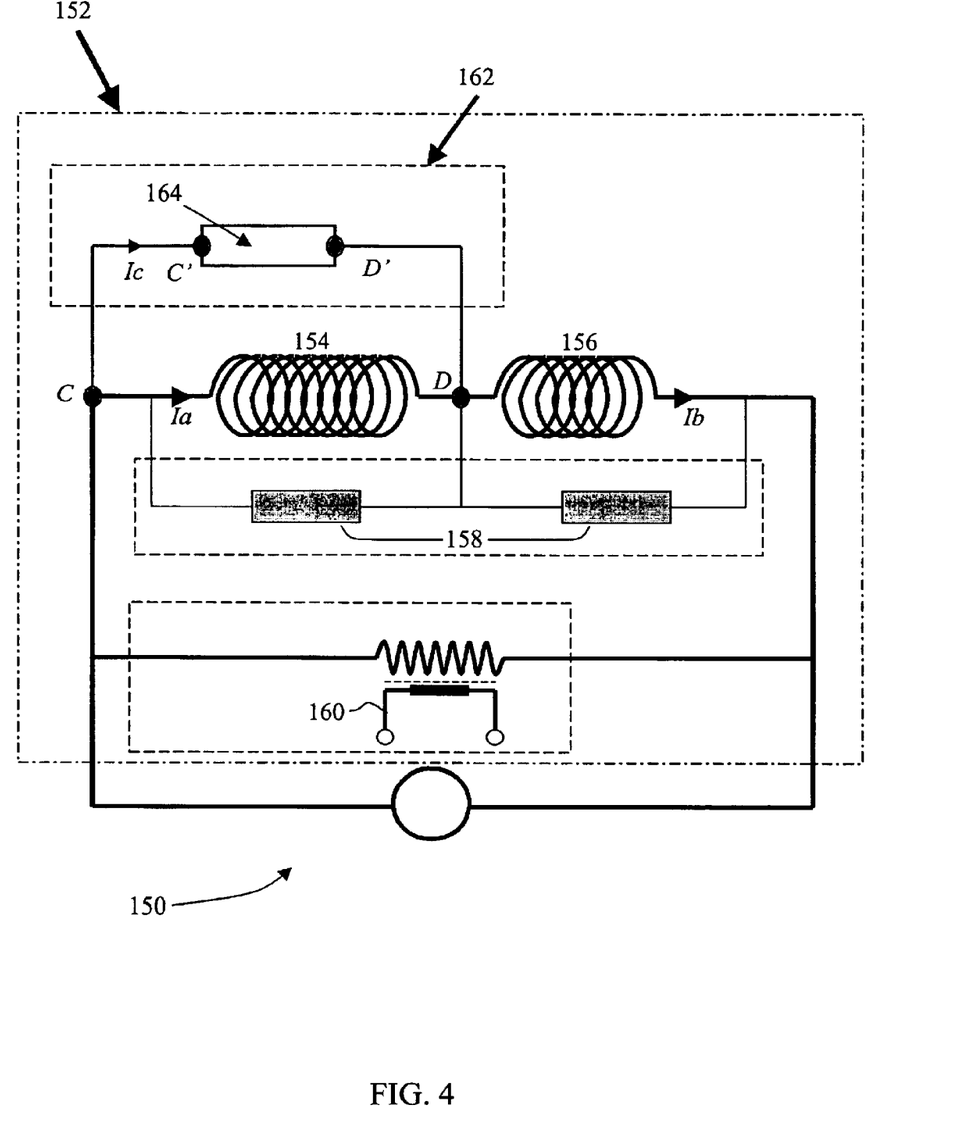
FIG. 4 is a schematic diagram of another circuitry of the superconducting MRI, NMR magnet system shown in FIG. 1 with a detection system.

FIG. 4 illustrates a one coil detection system 150 in which MRI system 10 includes a cryogenic temperature cryostat 152 in which a main coil 154, a shielding coil 156, a quench protection system 158, and a superconducting persistent switch 160 are positioned. A power supply 161 is typically positioned outside cryostat 152. System 150 also includes an environmental fluctuation circuit 162. In an exemplary embodiment, main coil 154 and shield coil 156 are wired in series receiving the same current, and environmental fluctuation circuit 162 is wired in parallel to one of main coil 154 and shielding coil 156. As illustrated in FIG. 4, environmental fluctuation circuit 162 is wired in parallel to main coil 154. When electrical current $I_a$ and $I_b$ are not equal due to outside electromagnetic disturbances, the differential current of main coils $I_a$ and shielding coils $I_b$ flows through superconducting circuit CC'D'D, thus with aid of a detection and controlling scheme identical or similar to that illustrated in FIG. 6, a differential current $I_c$ is detected, limited, and/or controlled. Although FIG. 4 illustrates that superconducting wire is connected to main coil 154 at points C and D in FIG. 4, the superconducting wire alternatively can be connected to shield coil 156 similarly, or be connected to the points within the coil. For example, in FIG. 4 points C and D are located at a plurality of edges of coil 154, points C and D may be located within coil 154 and coil 156 respectively (i.e., points C and/or D are located in a coiled section of coil(s) 154 and/or 156). The exact position of points C and D for example depends entirely on a particular magnet design and the requirements for environment disturbance compensation. FIG. 5 through FIG. 8 explain in additional detail how to detect these induced currents and how to control/eliminate these currents.

Figure 5:
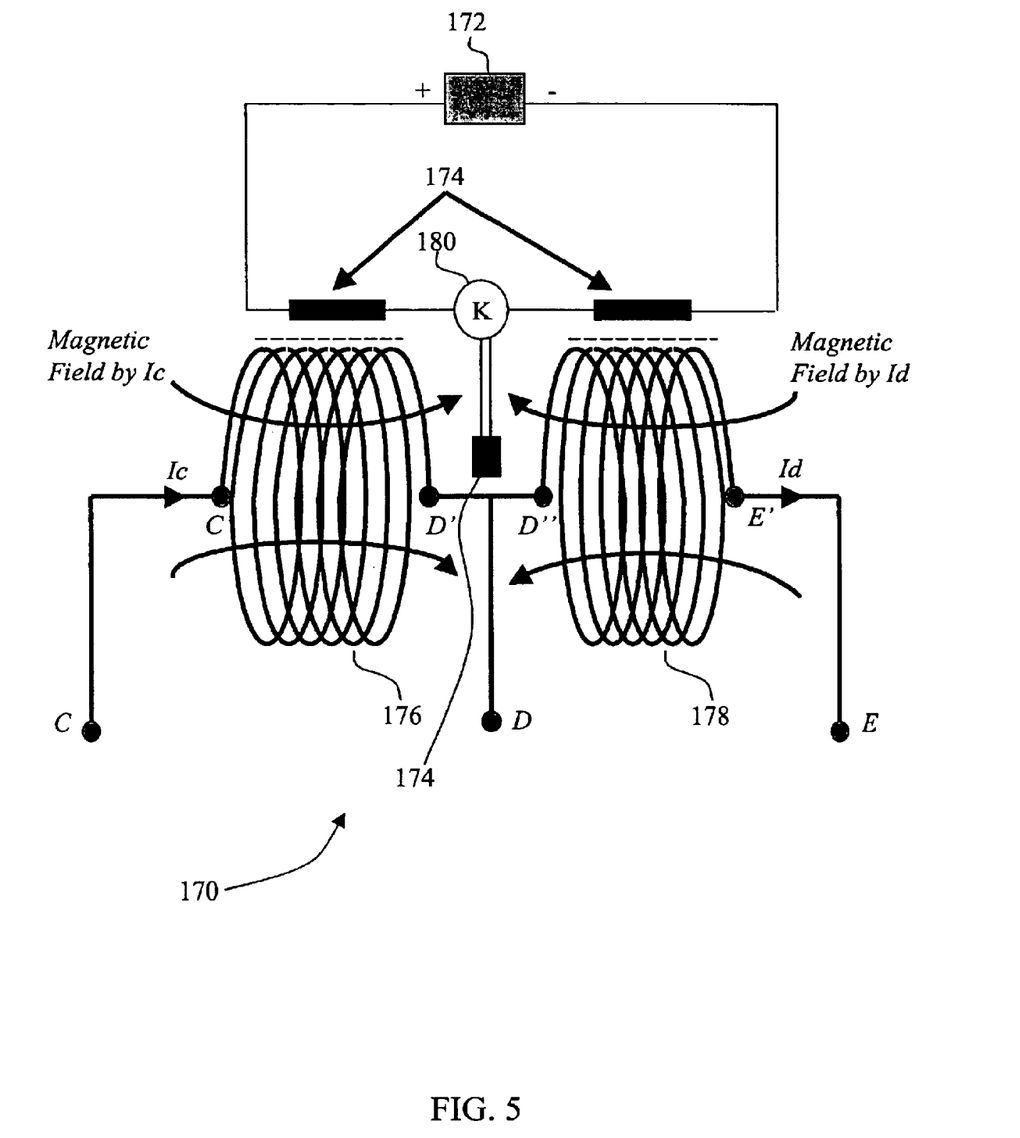
FIG. 5 is a schematic diagram of a circuitry of the superconducting detection system shown in FIG. 3.

FIG. 5 is a detailed illustration of a detection circuit 170 having two parts, one part is connected to points C, D, and E of FIG. 1, with two pieces of superconducting wire 176 and 178 wound on a single mandrel in bifilar fashion, the other part is a plurality of quench heaters 174 with a controlling switch 180 and a resistive quench heater power supply 172. A sensor 182 is positioned to sense electromagnetic fields. When the current either in CC'D'D circuit ($I_c$) or DD"E'E ($I_d$) or both starts to flow, and with the aid of detection sensor 182 (either mechanical or electronic as detailed below) and control switch K, quench heaters 174 are energized to heat the superconducting wires CC'D'D and DD"E'E and cause the superconducting wire to quench when current $I_c$ and/or $I_d$ reaches above a predetermined level (e.g., 2 amperes), and thus reduce the electrical currents $I_c$ and $I_d$ to zero, which forces electrical currents in main coil 122 $I_a$ and shield coil 124 $I_b$ to be the same. After sensor 182 detects zero current in $I_c$ and/or in $I_d$, control switch 180 switches off the current in the quench heaters 174. Thus the electrical currents of main coil 122 and shield coil 124 are the same again. A similar construction is also shown in FIG. 6 for one coil detection circuit 150 (shown in FIG. 4).

Figure 6:
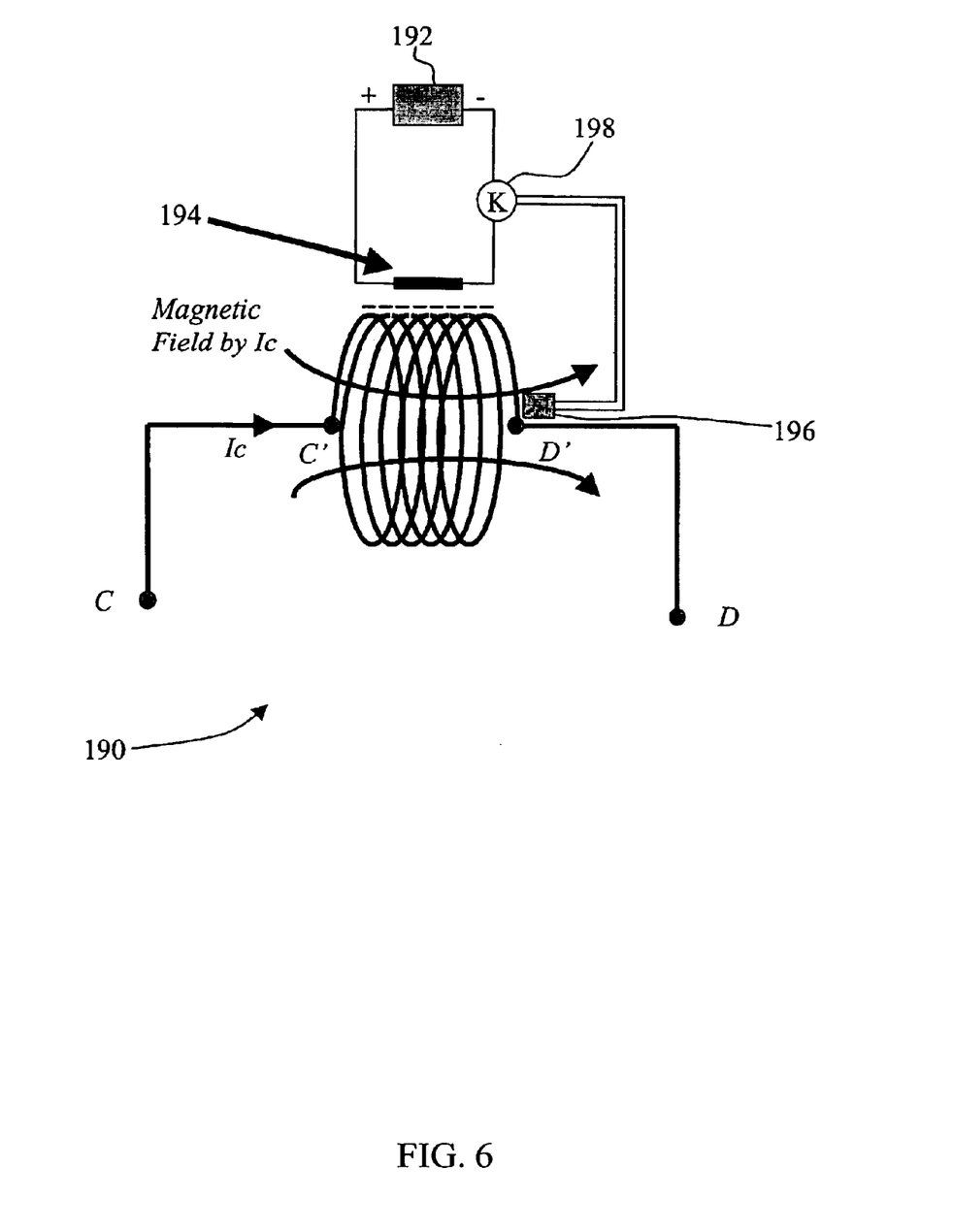
FIG. 6 is a schematic diagram of a circuitry of the superconducting detection system shown in FIG. 4.

FIG. 6 illustrates a single coil detection system 190 including a quench heater power supply 192 coupled to a quench heater 194 and a sensor 196 via a switch 198. When the current in CC'D'D circuit ($I_c$) starts to flow, and with the aid of detection sensor 196 (either mechanical or electronic as detailed below) and control switch K, quench heater 194 is energized to heat the superconducting wires CC'D'D and cause the superconducting wire to quench when current $I_c$ reaches above a predetermined level (e.g., 2 Amperes), and thus reduce the electrical currents $I_c$ to zero, which forces electrical currents in main coil 154 $I_a$ and shield coil 156 $I_b$ to be the same. After sensor 196 detects a zero current $I_c$ switch 198 switches off the current in quench heater 194. Thus the electrical currents of main coil 154 and shielding coil 156 are the same again.

Figure 7:
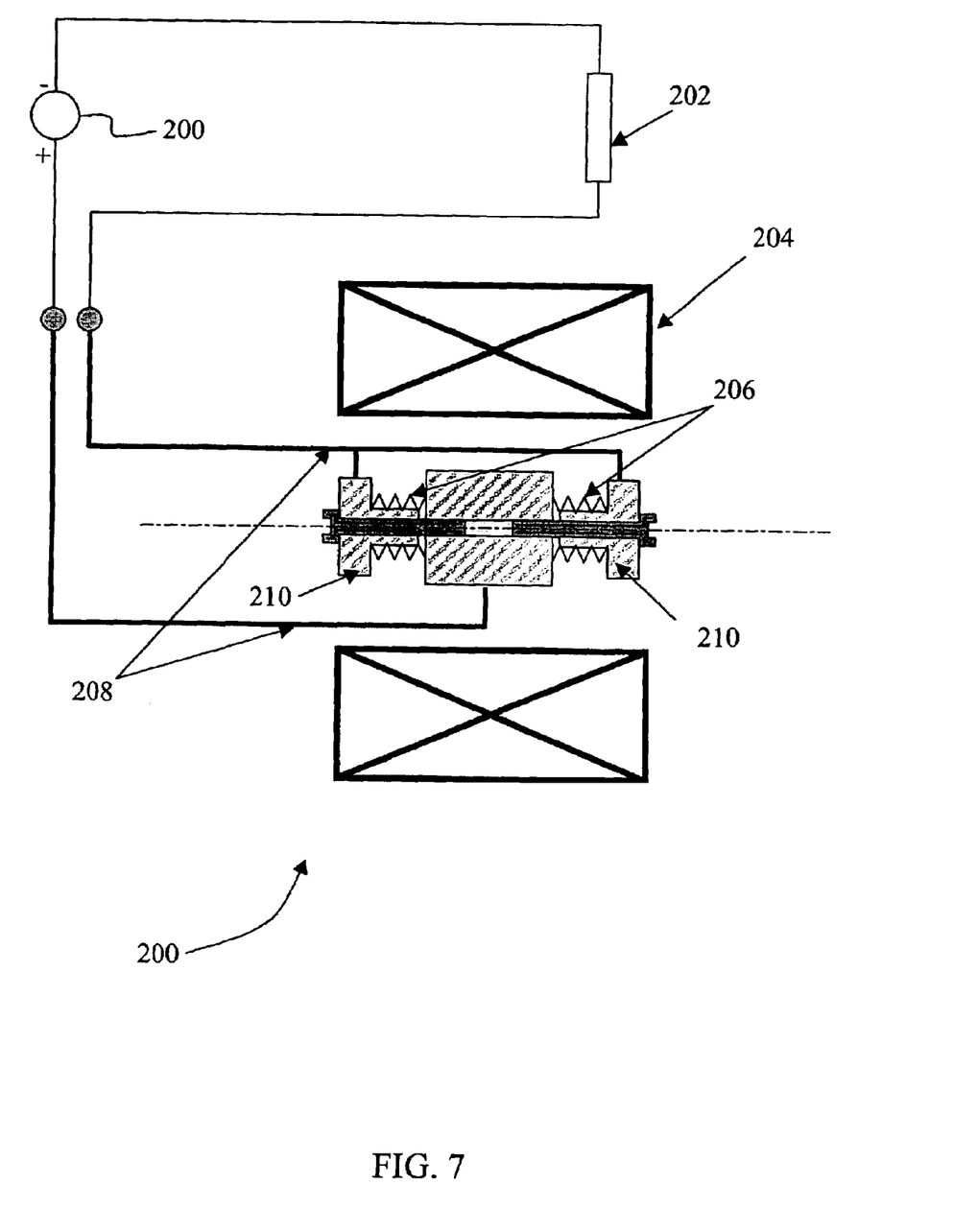
FIG. 7 is a schematic diagram of the detection systems with a mechanical sensor system shown in FIGS. 5 and 6.

FIG. 7 is a schematic of a mechanical sensor 200 for detection systems 118 and 150 (e.g., sensors 182 and 196), employed in some embodiments. A power source 201 is coupled to a quench heater 202 via wires 208 to a piston assembly 209. Mechanical sensor 200 includes a solenoid 204 which can be either a bifilar winding (as shown in FIG. 4) or a simple winding (as shown in FIG. 6). A plurality of mechanical springs 206 regulate a null level and a trigger level to control a metal piston on/off condition. Mounted within piston assembly 209 is a plurality of pistons 210. When no net magnetic field disturbances except original magnetic field created by the main and shielding coils present in solenoid 204, mechanical springs 206 are at a pre-set null level, and metal pistons 210 do not contact a stator, and hence, no current goes through the resistive quench heater(s) 202. When electrical current reaches a pre-set level (e.g., 2 amps) in solenoid 204 by the environment disturbances, the electromagnetic force on pistons 210 pulls one of the pistons 210 toward the stator, and the quench heater circuit engages, causing the superconducting wires (CC'D'D and/or D'D"E'E) to quench. When the current drops to zero after quench, piston 210 returns to its null position, and the quench circuit is disengaged. In one embodiment, pistons 210 are positioned opposing each other such that current flow in either direction CC'D'D or DD'C'C causes one of pistons 210 to move tow&d a center of assembly 209 to complete the circuit between power supply 201 and heater 202. In an alternative embodiment, only a single piston 210 is used.

Figure 8:
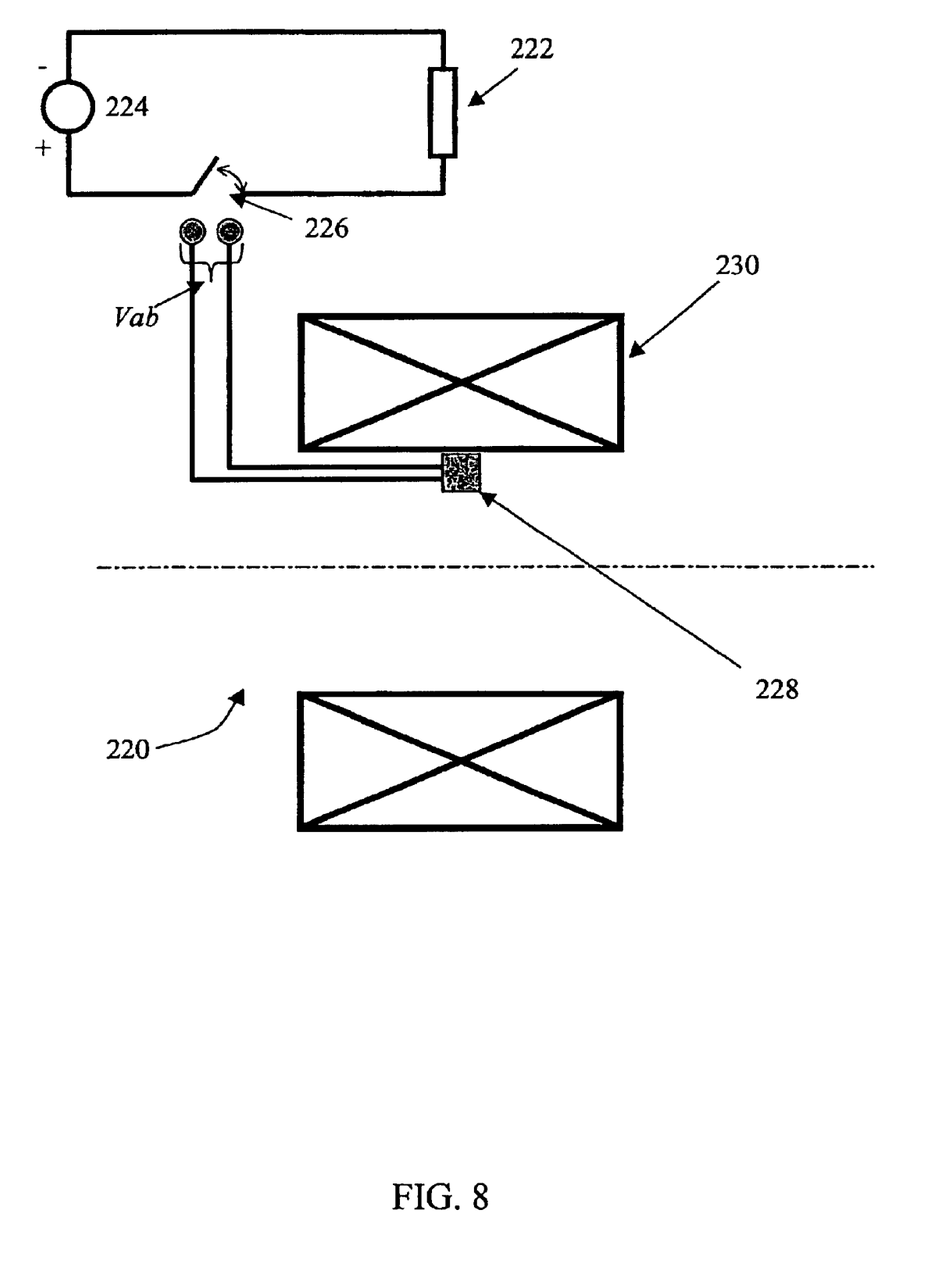
FIG. 8 is a schematic diagram of the detection systems with an electronic sensors system shown in FIGS. 5 and 6.

FIG. 8 is a schematic of an electronic sensor circuit 220 that is used in detection systems 118 and 150 (e.g., sensors 182 and 196), in some embodiments. Circuit 220 includes a quench heater 222 coupled to a power source 224 via a switch 226. An electronic sensor 228 is positioned within a solenoid 230. Detection sensor 228 is, in one embodiment, a Hall effect element. In an alternative embodiment, sensor 228 is other means of semiconductor elements or a pickup coil. With the presence of electrical current in solenoid 230, a net magnetic field fluctuation is detected by sensor 228. Sensor 228 outputs a related voltage (or a related current) signal to control switch 226 in an on state and an off state. If sensor 228 detects the current in solenoid 230 reaching a predetermined level, the corresponding output signal triggers switch 226 to close, and thus, current flows through quench heater 222, which starts to heat the superconducting wire to cause the superconducting wire to quench. When sensor 228 detects a zero current in solenoid 230, switch 226 is opened to de-energize heater 222 allowing any superconductive wires proximate heater 222 to return to a superconductive state. The predetermined level can be set electronically.

If the main coils and shielding coils operate on different currents, the above described detection methods and systems are employable with only a slight modification. For example, with both coils operational electrical currents $I_m$, $I_s$ known, and with their respective preset current changing limits known, a ratio of the currents $p=(I_m/I_s)$ is determined. Then the number of turns of CC'D'D superconducting wire to the number of turns of DD'E'E superconducting wire can be selected such that (CC'D'D turn number)/(DD'E'E turn number) is equal to p and wound in bifilar fashion, and then the above described methods and apparatus are used to detect environmental disturbances as described above.

While the invention has been described in terms of various specific embodiments, those skilled in the art will recognize that the invention can be practiced with modification within the spirit and scope of the claims.

What is claimed is:

1. A method of operating an imaging system having a main coil and a shield coil electromagnetically coupled to the main coil, said method comprising:
    monitoring for an external environmental fluctuation of electromagnetism; and
    controlling current flow through the main and shield coils based upon said monitoring using a quench heater.

2. A method in accordance with claim 1 wherein said monitoring comprises monitoring for an external environmental fluctuation of electromagnetism using a plurality of coils wired in series to each other and in parallel to the main and shield coils.

3. A method in accordance with claim 1 wherein said monitoring comprises monitoring for an external environmental fluctuation of electromagnetism using a coil wired in parallel to the main and shield coils, and an electronically activated sensor.

4. A method in accordance with claim 1 wherein said monitoring comprises monitoring for an external environmental fluctuation of electromagnetism using a coil wired in parallel to the main and shield coils, and a mechanically activated sensor.

5. A method in accordance with claim 1 wherein said monitoring comprises monitoring for an external environmental fluctuation of electromagnetism using a single coil wired in parallel to at least one of the main coil and the shield coil.

6. A method in accordance with claim 1 wherein said monitoring comprises monitoring for an external environmental fluctuation of electromagnetism using a single coil wired in parallel to only one of the main coil and the shield coil.

7. A method in accordance with claim 1 wherein said monitoring comprises monitoring for an external environmental fluctuation of electromagnetism using two coils wired in parallel, wherein the main coil and the shield coil are wired non-serially and the two coils have a turn number ratio in accordance with $I_m/I_s$, where $I_m$ is the current through the main coil, and $I_s$ is the current through the shield coil.

8. A magnet system comprising:
    at least one main coil; and
    at least one environmental fluctuation circuit operationally coupled to said at least one main coil, said circuit comprising:
        at least one detection coil; and
        a quench heater positioned proximate said detection coil.

9. A system in accordance with claim 8 further comprising a shield coil positioned to shield an electromagnetic field generated by said main coil, wherein said at least one environmental fluctuation circuit comprises a first environmental fluctuation circuit operationally coupled to said main coil, and a second environmental fluctuation circuit operationally coupled to said shield coil.

10. A system in accordance with claim 9 wherein said main coil and said shield coil are wired non-serially, and said first environmental fluctuation circuit and said second environmental fluctuation circuit have a turn number ratio in accordance with $I_m/I_s$, where $I_m$ is the current through said main coil, and $I_s$ is the current through said shield coil.

11. A system in accordance with claim 9 wherein said main coil and said shield coil wired in series, and said first environmental fluctuation circuit and said second environmental fluctuation circuit wired in series to each other and in parallel to said main and shield coils.

12. A system in accordance with claim 8, wherein said environmental fluctuation circuit further comprises an electronically activated sensor positioned to sense current through said detection coil.

13. A system in accordance with claim 8, wherein said environmental fluctuation circuit further comprises a mechanically activated sensor configured to sense current through said detection coil.

14. A system in accordance with claim 13, wherein said mechanically activated sensor comprises a solenoid and at least one first piston at least partially positioned within a bore of said solenoid.

15. A system in accordance with claim 14 further comprising a second piston at least partially positioned in said bore opposite said first piston such that sufficient current flow through said solenoid in any direction will cause one of said first and second pistons to close a circuit to said quench heater.

16. A system in accordance with claim 8 wherein said at least one environmental fluctuation circuit operationally coupled to said at least one main coil at an edge of said at least one main coil.

17. A system in accordance with claim 8 wherein said at least one environmental fluctuation circuit operationally coupled to said at least one main coil at a point within said at least one main coil.

18. A method of operating an imaging system comprising a main coil, a shield coil positioned to shield an electromagnetic field generated by the main coil, and at least one environmental fluctuation circuit operationally coupled to at least one of the main coil and the shield coil, the circuit comprising at least one detection coil, and a quench heater positioned proximate the detection coil, said method comprising:
    energizing the quench heater such that the detection coil is in a non-superconductive state;
    supplying current to the main coil and the shield coil until a predetermined current is reached while the detection coil is in the non-superconductive state;

activating a persistence switch to a superconductive state; and de-energizing the quench heater when the persistence switch is in the superconductive state.

19. A method in accordance with claim 18 further comprising:

monitoring the current flow through the detection coil for a current above a predetermined threshold; and energizing the quench heater when the current flow through the detection coil is above the threshold.

20. A method in accordance with claim 19 further comprising:

monitoring the current flow through the detection coil for a zero current; and de-energizing the quench heater when the current flow through the detection coil is zero.

21. A method in accordance with claim 18, wherein the imaging system comprises two environmental fluctuation circuits in series to each other and in parallel to the main coil and the shield coil, said method further comprising energizing both quench heaters such that both detection coils are in non-superconductive states.

22. A method in accordance with claim 21 further comprising:

monitoring the current flow through both detection coils for a current above a predetermined threshold; and energizing both quench heaters when the current flow through one of the two detection coils is above the threshold.

* * * * *